(12) United States Patent
Aude et al.

(10) Patent No.: US 7,474,133 B1
(45) Date of Patent: Jan. 6, 2009

(54) APPARATUS AND METHOD FOR HIGH-SPEED SERIAL COMMUNICATIONS

(75) Inventors: Arlo Aude, Atlanta, GA (US); Jitendra Mohan, Santa Clara, CA (US); Ivan Duzevik, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 43 days.

(21) Appl. No.: 11/633,727

(22) Filed: Dec. 5, 2006

(51) Int. Cl.
*H03K 3/00* (2006.01)
(52) U.S. Cl. .................. 327/108; 327/563; 330/258
(58) Field of Classification Search ............... 327/108, 327/563; 330/258
See application file for complete search history.

(56) References Cited

U.S. PATENT DOCUMENTS

| | | | |
|---|---|---|---|
| 5,877,718 A | 3/1999 | Andoh et al. | |
| 6,111,437 A | 8/2000 | Patel | |
| 6,310,520 B1 * | 10/2001 | Walden | 330/295 |
| 6,504,499 B1 | 1/2003 | Masenas et al. | |
| 6,801,059 B2 * | 10/2004 | Lee | 327/65 |
| 6,956,436 B2 | 10/2005 | Li et al. | |
| 7,157,944 B1 | 1/2007 | Wang et al. | |

* cited by examiner

*Primary Examiner*—Kenneth B. Wells (57) ABSTRACT

An apparatus, device, and method for high-speed serial communications are provided. An input circuit is operable to receive an input signal, where the input circuit includes transistors forming (i) a first differential pair associated with a first current source and (ii) a second differential pair associated with a second current source. An output circuit is coupled to the input circuit and is operable to generate an output signal based on the input signal. A sensing circuit is operable to estimate a voltage associated with one of the current sources. A comparator is operable to compare the estimated voltage and a reference voltage and to selectively enable one of the differential pairs and disable another of the differential pairs based on the comparison. The differential pairs could be enabled and disabled using a first switch associated with the first differential pair and a second switch associated with the second differential pair.

20 Claims, 9 Drawing Sheets

APPARATUS AND METHOD FOR HIGH-SPEED SERIAL COMMUNICATIONS

CROSS-REFERENCE TO RELATED APPLICATIONS

This disclosure is related to U.S. patent application Ser. No. 11/633,728 entitled "APPARATUS AND METHOD FOR LOSS OF SIGNAL DETECTION IN A RECEIVER" filed on Dec. 5, 2006, which is hereby incorporated by reference.

TECHNICAL FIELD

This disclosure is generally directed to communication systems and more specifically to an apparatus and method for high-speed serial communications.

BACKGROUND

Serial communications are used in a wide variety of communication and computing devices and systems. Serial communications typically involve communicating data serially over a single link or over multiple links. One example of a serial device is a Low Voltage Differential Signalling or "LVDS" device. LVDS devices are serial devices designed to communicate over twisted-pair cables and are often used to form high-speed computer networks and buses. LVDS transmitters typically transmit two voltage signals (one over each twisted-pair cable), and LVDS receivers typically compare the voltage signals and determine differences between the voltage signals. The determined differences are used to recover information represented using these differential voltage signals.

Conventional LVDS and other serial devices may suffer from a wide variety of problems. For example, conventional serial devices often have very bad power supply rejection ratios (PSRRs), consume a large amount of power, and have wide variations in gain and bandwidth across their common mode voltage ranges. Also, conventional serial devices often have insufficient abilities to detect and ignore received signals falling within specified threshold limits, which can lead to excess noise and power consumption.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
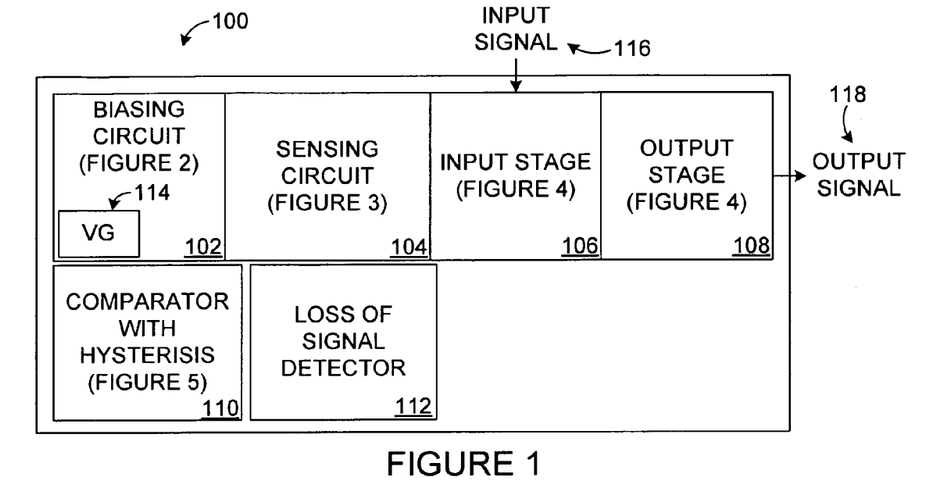
FIGS. 1 through 6 illustrate an example serial receiver according to one embodiment of this disclosure.

FIGS. 1 through 6 illustrate an example serial receiver according to one embodiment of this disclosure. More specifically, FIG. 1 illustrates an example serial receiver 100, and FIGS. 2 through 6 illustrate example components of the serial receiver 100. The embodiments of the serial receiver 100 and its components shown in FIGS. 1 through 6 are for illustration only. Other embodiments of the serial receiver 100 or its components could be used without departing from the scope of this disclosure.

As shown in FIG. 1, the serial receiver 100 includes a biasing circuit 102, a sensing circuit 104, an input circuit or stage 106, an output circuit or stage 108, a comparator 110, and a loss of signal detector 112. The biasing circuit 102 includes a voltage generator (VG) 114. In general, the serial receiver 100 operates to receive an input signal 116 and generate an output signal 118. The output signal 118 represents digital data recovered from the input signal 116.

Figure 2:
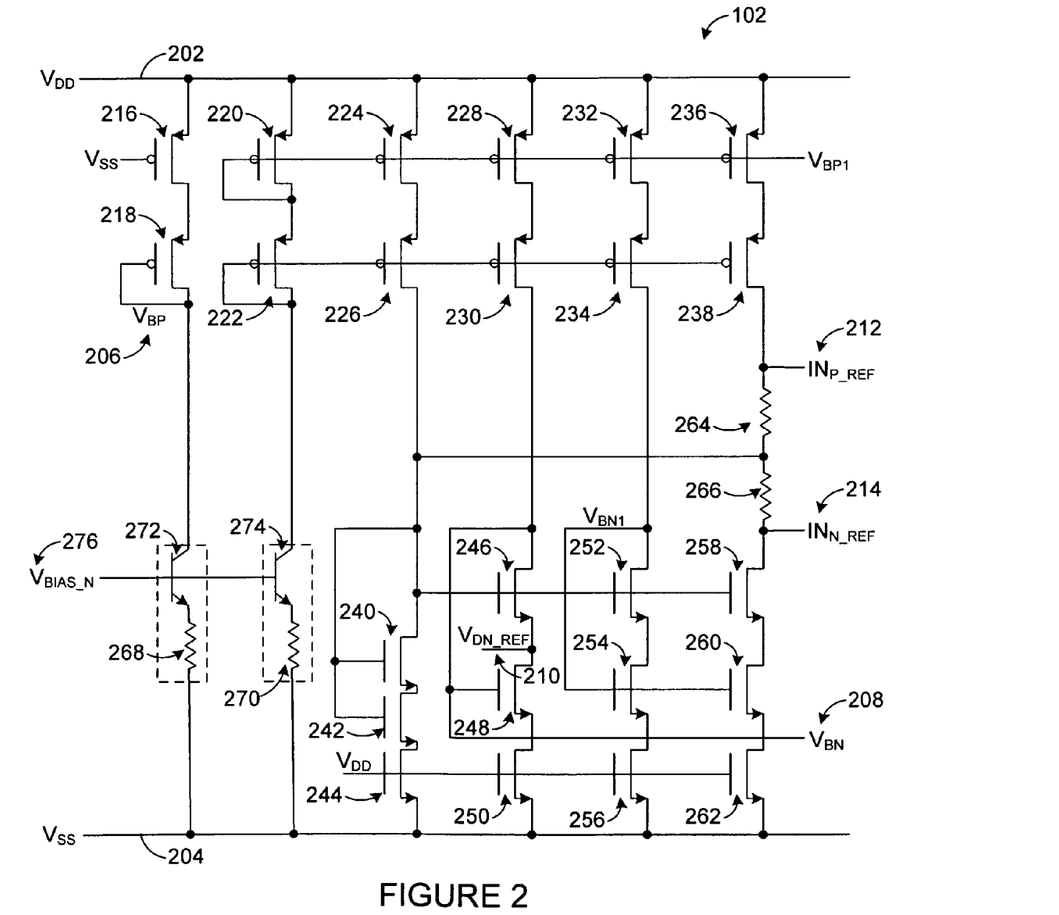

The biasing circuit 102 produces one or more bias voltages used by other components of the serial receiver 100. For example, the biasing circuit 102 may produce three biasing voltages used by various other components in the serial receiver 100 and two bias voltages used exclusively by the loss of signal detector 112. The biasing circuit 102 includes any suitable structure capable of generating one or more bias voltages or other bias values. One example embodiment of the biasing circuit 102 is shown in FIG. 2.

Figure 3:
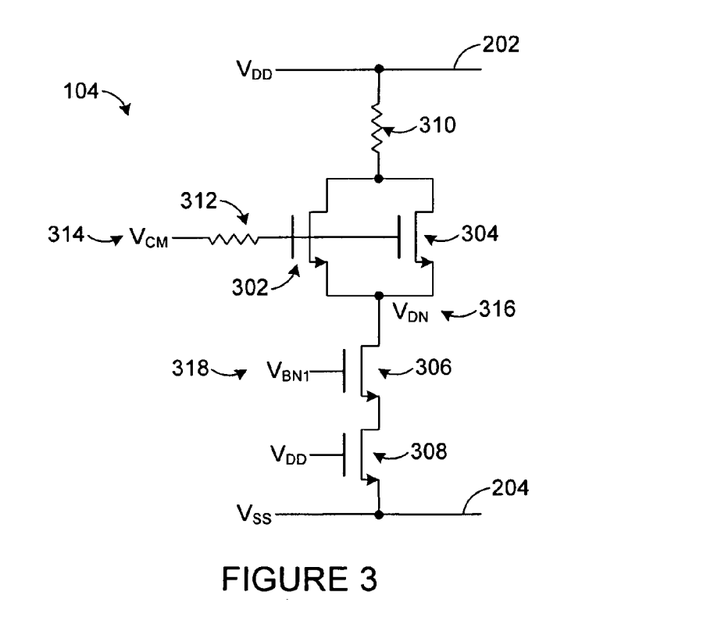

The sensing circuit 104 determines a voltage associated with a current source in the input stage 106. This voltage is used by the comparator 110 to determine if the current source is at or near a saturation level. The comparator 110 could then adjust the operation of the serial receiver 100 based on the determination. The voltage associated with the current source in the input stage 106 could be determined using a common mode voltage of the serial receiver 100. The sensing circuit 104 includes any suitable structure capable of determining a voltage of a current source in the serial receiver 100. One example embodiment of the sensing circuit 104 is shown in FIG. 3.

Figure 4:
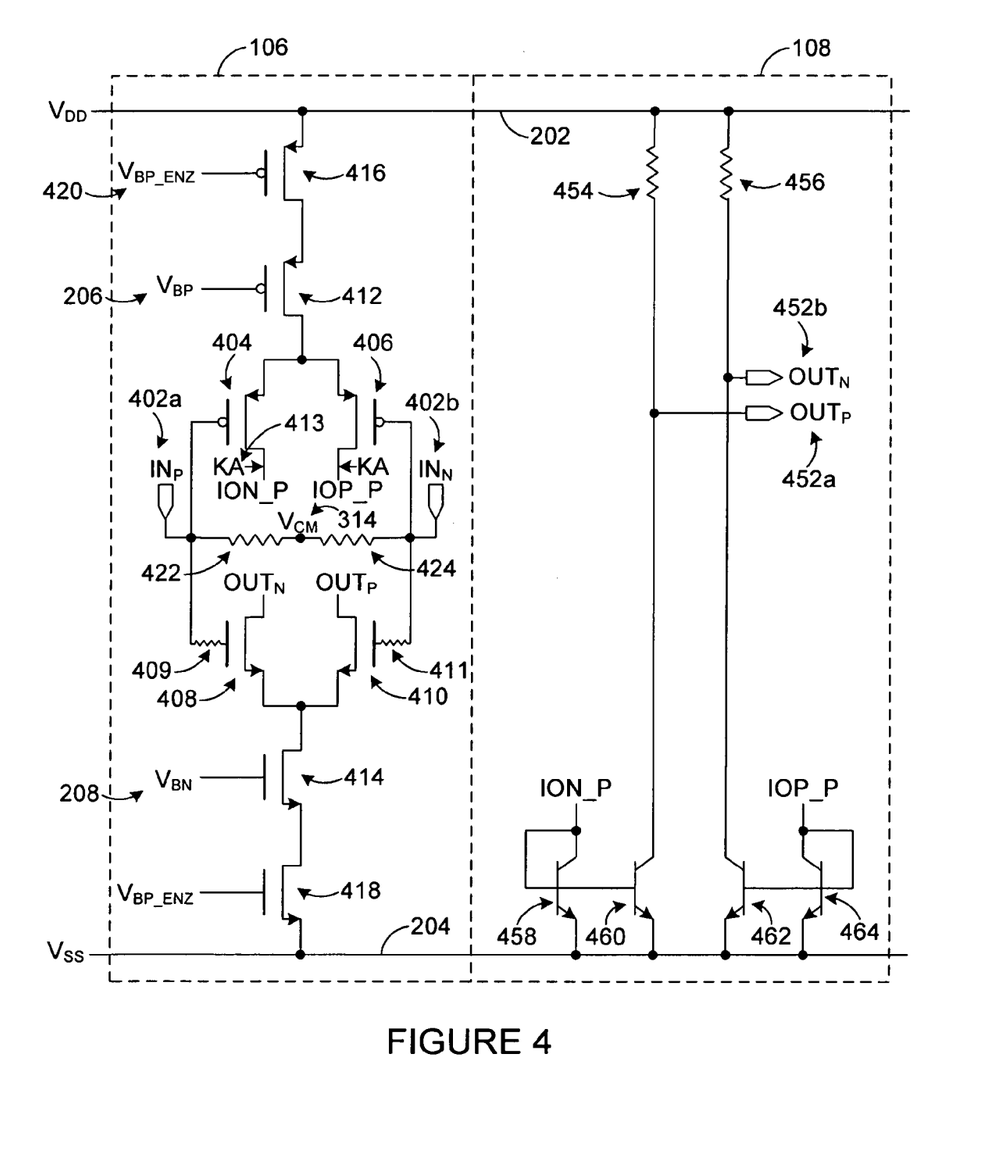

The input stage 106 and the output stage 108 receive an input signal 116 and provide an output signal 118, respectively. The input signal 116 represents a signal received over a serial communication link, and the output signal 118 represents data recovered from the input signal 116. In particular embodiments, the input signal 116 represents differential input signals, and the output signal 118 represents data recovered based on voltage differences between the differential input signals. The input stage 106 includes any suitable structure capable of receiving an input signal. The output stage 108 includes any suitable structure capable of generating an output signal. Example embodiments of the input stage 106 and the output stage 108 are shown in FIG. 4.

Figure 5:
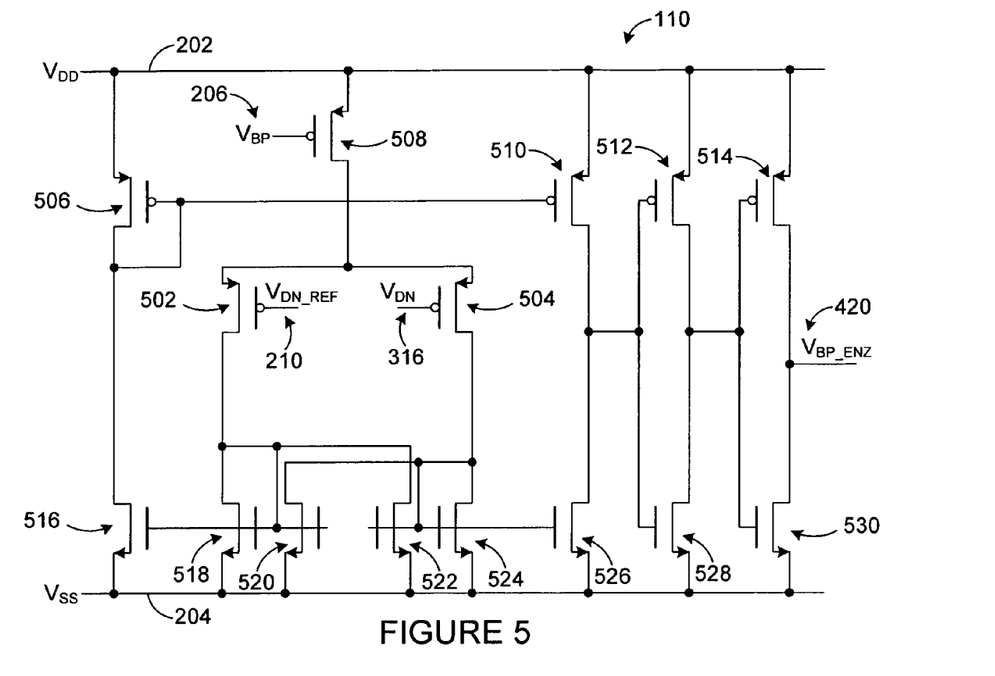

The comparator 110 adjusts the operation of the serial receiver 100 based on the voltage associated with a current source in the input stage 106 as determined by the sensing circuit 104. For example, the comparator 110 may compare the voltage measured by the sensing circuit 104 with one of the bias voltages produced by the biasing circuit 102, such as a bias voltage related to a saturation voltage ($V_{DSAT}$). The comparator 110 generates an output to control the operation of the input stage 106, thereby helping to ensure that the input stage 106 can properly handle the input signal 116. The comparator 110 could also implement a hysteresis function to prevent chattering or unnecessary adjustments to the input stage 106. The comparator 110 includes any suitable structure capable of comparing multiple signals. One example embodiment of the comparator 110 is shown in FIG. 5.

The loss of signal detector 112 determines if and when the input signal 116 falls within specified threshold limits. For example, the serial receiver 100 may be required to ignore differential input signals 116 that fall between ±50 mV. The loss of signal detector 112 attempts to detect this condition and outputs a signal indicating when it occurs. The serial receiver 100 may use this signal to stop processing the input signal 116 when this condition occurs, which may help to reduce noise and power consumption of the serial receiver 100. The loss of signal detector 112 includes any suitable structure capable of detecting an input signal 116 that falls within specified threshold limits. One example embodiment of the loss of signal detector 112 is shown in FIGS. 7 through 14.

Figure 6:
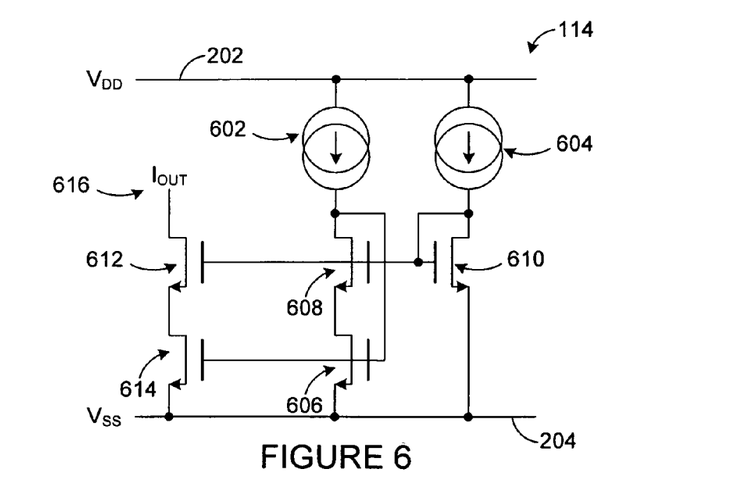

The voltage generator 114 generates a scalable saturation reference voltage, which may be used by the biasing circuit 102 to generate one or more of the bias voltages. For example, the voltage generator 114 may generate a voltage that represents the saturation voltage ($V_{DSAT}$) of a current source in the serial receiver 100. The biasing circuit 102 may then use this voltage to generate a bias voltage provided to the comparator 110. The voltage generator 114 includes any suitable structure capable of generating a reference voltage. One example embodiment of the voltage generator 114 is shown in FIG. 6.

As shown in FIG. 2, the biasing circuit 102 includes various components coupled between a voltage rail ($V_{DD}$) 202 and a voltage rail ($V_{SS}$) 204. Each of these voltage rails 202-204 could provide any suitable voltage, such as when the voltage rail 202 represents 2.5V or 3.3V and the voltage rail 204 represents ground. In this example, the biasing circuit 102 generates five different bias voltages 206-214. Bias voltages ($V_{BP}$ and $V_{BN}$) 206-208 represent bias voltages provided to a Positive-Channel Metal Oxide Semiconductor (PMOS) current source and a Negative-Channel Metal Oxide Semiconductor (NMOS) current source, respectively, in the input stage 106. Bias voltage ($V_{DN\_REF}$) 210 represents a bias voltage provided to the comparator 110. Bias voltages ($IN_{P\_REF}$ and $IN_{N\_REF}$) 212-214 represent bias voltages used by the loss of signal detector 112.

In this example embodiment, the biasing circuit 102 includes PMOS transistors 216-238, NMOS transistors 240-262, resistors 264-270, and bipolar junction transistors (BJTs) 272-274. In particular embodiments, the bulks of the transistors 216-238 may be coupled to the voltage rail 202, and the bulks of the transistors 240-262 may be coupled to the voltage rail 204. Also, in particular embodiments, the currents flowing through the transistors 216-218 and through the transistors 232-234 could be approximately 400 μA, while the currents flowing through the transistors 220-222, 224-226, 228-230, and 236-238 could be approximately 100 μA. The resistors 264-266 could have any suitable resistance, such as 2 kΩ each. The resistors 268-270 and the transistors 272-274 could be scaled and operate based on a biasing voltage 276 provided to the transistors 272-274. For example, the resistor 268 and the transistor 272 could be four times larger (in size) than the resistor 270 and the transistor 274. Here, the biasing voltage 276 can be used to provide external fail-safe biasing for the serial receiver 100.

In this configuration, the bias voltage 206 is generated from a diode represented by transistor 220. This bias voltage 206 may drive a PMOS current source in the input stage 106 and can have a low impedance at high frequency, which may enable fast recovery when the PMOS current source is switched on and improve power supply rejection ratios. Although not shown, an additional capacitance between this node and the voltage rail 202 could improve recovery time and further improve power supply rejection ratios. Similarly, the bias voltage 208 is generated from a diode represented by transistor 248 and may have a low impedance and drive an NMOS current source in the input stage 106.

The bias voltage 210 is generated at the source of the transistor 246. In this example, the bias voltage 210 may approximately equal the voltage present at the source of the transistor 248 plus three times the saturation voltage generated by the voltage generator 114.

The bias voltages 212-214 are generated by applying a current across the two resistors 264-266. In this example, any mismatch in up/down currents in the resistors 264-266 may simply affect the common mode voltage. Since the common mode voltage may be somewhat arbitrary, this may cause no harm in the serial receiver 100. Also, as described below, the bias voltages 212-214 can be used for both PMOS and NMOS circuits in the loss of signal detector 112 since the circuits both work properly with this common mode.

In this embodiment, the transistors 244, 250, 256, 262 are used as dummy switches. These switches are used to help mimic the behavior of a switch associated with an NMOS differential pair in the input stage 106. Similarly, the transistor 216 is used as a dummy switch. This switch is used to help mimic the behavior of a switch associated with a PMOS differential pair in the input stage 106.

As shown in FIG. 3, the sensing circuit 104 includes various components coupled between the voltage rails 202-204. In this example, the sensing circuit 104 includes NMOS transistors 302-308 and resistors 310-312. In particular embodiments, the resistor 310 represents an 8 kΩ resistor, and the resistor 312 represents a 32 kΩ resistor. Also, the bulks of the transistors 302-308 may be coupled to the voltage rail 204, and the current flowing through the sensing circuit 104 could be approximately 50 μA.

In this example embodiment, the sensing circuit 104 may be referred to as a differential pair "replica" because the input stage 106 includes multiple differential pairs and the sensing circuit 104 replicates one of them. Here, the transistors 302-304 represent a replica NMOS differential pair. Gates of the transistors 302-304 receive a common mode voltage ($V_{CM}$) 314 via the resistor 312. The common mode voltage 314 may originate in the input stage 106. The resistor 312 may be used, in conjunction with the gate capacitance of the transistors 302-304, to filter the common mode voltage 314. Sources of the transistors 302-304 produce a voltage ($V_{DN}$) 316, which represents a measure of a current source's drain-to-source voltage ($V_{DS}$) in the input stage 106. The voltage 316 is provided to the comparator 110 for use in determining if the voltage 316 is at or near a threshold voltage.

As shown in FIG. 4, the input stage 106 and the output stage 108 include various components coupled between the voltage rails 202-204. In this example, the input stage 106 receives a differential input signal, which is represented by signals 402a-402b. The signals 402a-402b are provided to transistors 404-410, which form two differential pairs. Here, the transistors 404-406 form a PMOS differential pair, and the transistors 408-410 form an NMOS differential pair. The transistors 404-406 are coupled to a transistor 412, which represents a PMOS current source and has a gate coupled to the bias voltage 206. Similarly, the transistors 408-410 are coupled to a transistor 414, which represents an NMOS current source and has a gate coupled to the bias voltage 208. As shown here, the gates of the transistors 408 and 410 are coupled to resistors 409 and 411, respectively. The resistors 409 and 411 add a pole to the NMOS path response. When the PMOS path is selected, the transfer function from input to output may have two poles (one from input nodes ION_P/IOP_P and another from output nodes $OUT_N/OUT_P$). Without the resistors 409 and 411, when the NMOS path is selected, the transfer function from input to output may have only one pole (from the output nodes $OUT_N/OUT_P$). With the addition of the resistors 409 and 411, a second pole is added to the NMOS path. The resistors 409 and 411 may be of a size such that the pole matches the pole at the ION_P/IOP_P nodes.

The transistors 412-414 are coupled to transistors 416-418, respectively, which act as switches to selectively enable and disable the differential pairs. Gates of the transistors 416-418 receive an enable signal 420. In particular embodiments, the bulks of the transistors 404-406, 412, 416 may be coupled to the voltage rail 202, and the bulks of the transistors 408-410, 414, 418 may be coupled to the voltage rail 204. The input stage 106 further includes two resistors 422-424, which create the common mode voltage 314 at their connection point. The resistors 422-424 could have any suitable resistance(s), such as 50Ω each. The current flowing through the input stage 106 could be approximately 400 μA.

In this example, the output stage 108 generates a differential output signal, which is represented by signals 452a-452b. The signals 452a-452b are generated by passing currents through two resistors 454-456. The resistors 454-456 collectively represent a load coupled to the input stage 106 and could represent any suitable resistors. The resistors 454-456 could, for example, represent 2 kΩ poly resistors. The output stage 108 also includes four bipolar junction transistors 458-464. The transistors 458, 464 are coupled to the transistors 404-406 in the input stage 106, and the transistors 460-462 are coupled to the transistors 408-410 in the input stage 106 and to the resistors 454-456. In particular embodiments, the bulks of the transistors 458-464 may be coupled to the voltage rail 204, and the current flowing through each transistor 458-464 could be approximately 200 μA. Also, in particular embodiments, when the PMOS path (transistors 404-406) is selected and the input signal is very large, the transistors 458 and 464 could turn off because they receive no current when the input signal is at its maximum swing. To avoid this, a small keep-alive current (KA) 413 can be injected into each of the input nodes ION_P and IOP_P.

In this example embodiment, the resistors 422-424 in the input stage 106 are used to generate the common mode voltage 314, which is provided to the sensing circuit 104. The transistors 404-410 in the input stage 106 form parallel PMOS and NMOS differential pairs, and the NMOS differential pair may be replicated by the sensing circuit 104. In some embodiments, the PMOS differential pair may be larger than the NMOS differential pair, such as 2.5 times as large. This may help to equalize the differential pairs' gains into the load (the output stage 108). In particular embodiments, both differential pairs operate on a current (such as 400 μA) derived from a voltage across the resistors 454-456 such that the maximum output voltage is held constant. An output current from the NMOS differential pair drives the load (output stage 108) directly, and an output current from the PMOS differential pair is mirrored to the load (output stage 108) using a 1:1 current mirror formed from the transistors 458-464.

The transistors 412-414 in the input stage 106 act as tail current sources for the differential pairs. The differential pairs can be enabled and disabled using switches on the source sides of the tail current sources. The switches are implemented using the transistors 416-418, which operate using the same enable signal 420 to ensure that only one of the differential pairs is operating at any given time (although there might be a slight overlap when toggling the differential pairs). The enable signal 420 provided to the transistors 416-418 may be generated by the comparator 110, which uses the enable signal 420 to control which differential pair is operating.

As shown in FIG. 5, the comparator 110 includes various components coupled between the voltage rails 202-204. In this example, the comparator 110 includes PMOS transistors 502-514 and NMOS transistors 516-530. In particular embodiments, the bulks of the transistors 502-514 may be coupled to the voltage rail 202, and the bulks of the transistors 516-530 may be coupled to the voltage rail 204. Also, the current flowing through each transistor 506-508 could be approximately 50 μA.

In this example embodiment, the comparator 110 compares the voltage 316 generated by the sensing circuit 104 to the reference bias voltage 210 generated by the biasing circuit 102. The reference bias voltage 210 represents a scaled version of the saturation voltage ($V_{DSAT}$) generated by the voltage generator 114. The voltage 316 and the reference bias voltage 210 are provided to a pair of diodes coupled in parallel with cross-coupled NMOS transistors (transistors 518-524). The remaining transistors mirror, sum, and increase the gain of the diode currents to produce the enable signal 420.

When the voltage 316 is less than the reference bias voltage 210, the NMOS differential pair current source (transistor 414) in the input stage 106 is turned off (via transistor 418), and the PMOS differential pair current source (transistor 412) in the input stage 106 is turned on (via transistor 416). The opposite may occur when the voltage 316 is larger than the reference bias voltage 210.

To prevent "chattering" or rapid switching between the PMOS and NMOS differential pairs (such as due to noise, oscillations, or slow rises and falls in the common mode voltage), the comparator 110 implements a hysteresis function using the various transistors. As an example, over different process-voltage-temperature (PVT) variations, the hysteresis function may vary between 90 mV and 140 mV. The hysteresis function may be low enough to ensure that the NMOS differential pair current source (transistor 414) stays in saturation at its switch point. This hysteresis function can be implemented using the transistors 520-522.

As shown in FIG. 6, the voltage generator 114 includes various components coupled between the voltage rails 202-204. In this example, the voltage generator 114 includes current sources 602-604 and NMOS transistors 606-614. The current sources 602-604 may represent current mirrors that generate identical or near-identical reference currents. Also, the transistors 606-614 may have their bulks coupled to the voltage rail 204.

In this example embodiment, the transistor 606 is configured as a diode and has a gate-to-source voltage ($V_{GS}$) approximately equal to its threshold voltage ($V_T$) plus its saturation voltage ($V_{DSAT}$). The transistor 608 may be sized similarly to the transistor 606 and have the same gate-to-source voltage (as long as both transistors 606-608 are saturated). The transistor 610 is biased with the same current as the transistors 606-608, but the transistor 610 may have a smaller width-to-length ratio. This forces the gate-to-source voltage of the transistor 610 to be higher than that of the transistor 606. By selecting appropriate width-to-length ratios of the transistors 606-610, a desired scalable reference voltage can be produced at the drain of the transistor 608. The other transistors 612-614 may have the same width-to-length ratio as the transistors 602-604. These transistors 612-614 operate to produce an output current 616, which may approximately equal the reference currents generated by the current sources 602-604.

In the circuit shown in FIG. 6, it can be shown that:

$$V_{GS2} - V_{GS1} = (\sqrt{N} - 1)(X_{GS1} - V_T)$$

where $VGS_1$ and $VGS_2$ represent the gate-to-source voltages of the transistors 606-608, and $V_T$ represents the transistors' threshold voltage. N can be defined as:

$$N = \frac{WLratio_{606,608}}{WLratio_{610}}$$

where $WLratio_{606,608}$ represents the width-to-length ratio of the transistors 606-608, and $WLratio_{610}$ represents the width-to-length ratio of the transistor 610. In other words, N represents the extent to which the width-to-length ratio of the transistors 606-608 is greater than the width-to-length ratio of the transistor 610. By selecting the appropriate value of N, the source voltage of transistor 606 or the drain voltage of transistor 608 can be set to a suitable saturation voltage, which can be used as described above to generate the bias voltage 210.

As an example, the width-to-length ratio of the transistor 610 could be four times smaller than the width-to-length ratio of the transistors 606-608. Here, the gate-to-source voltage of the transistor 610 approximately equals its threshold voltage plus two times the saturation voltage. This results in a drain voltage on the transistor 608 approximately equal to the saturation voltage. As another example, the width-to-length ratio of the transistor 610 could be nine times smaller than the width-to-length ratio of the transistors 606-608. The gate-to-source voltage of the transistor 610 then approximately equals its threshold voltage plus three times the saturation voltage. This results in a drain voltage on the transistor 608 approximately equal to two times the saturation voltage. Note that the value of N may be increased to compensate for short channel effects and threshold shift due to bulk bias.

Although FIGS. 1 through 6 illustrate an example serial receiver 100 and its components, various changes may be made to FIGS. 1 through 6. For example, while FIGS. 2 through 6 illustrate example embodiments of the components in the serial receiver 100, the components in the serial receiver 100 could have any other suitable design or layout. Also, while specific components (such as types of transistors and resistors) and values (such as currents and resistances) have been described above, other embodiments of the serial receiver 100 could use different components or values.

Figure 7:
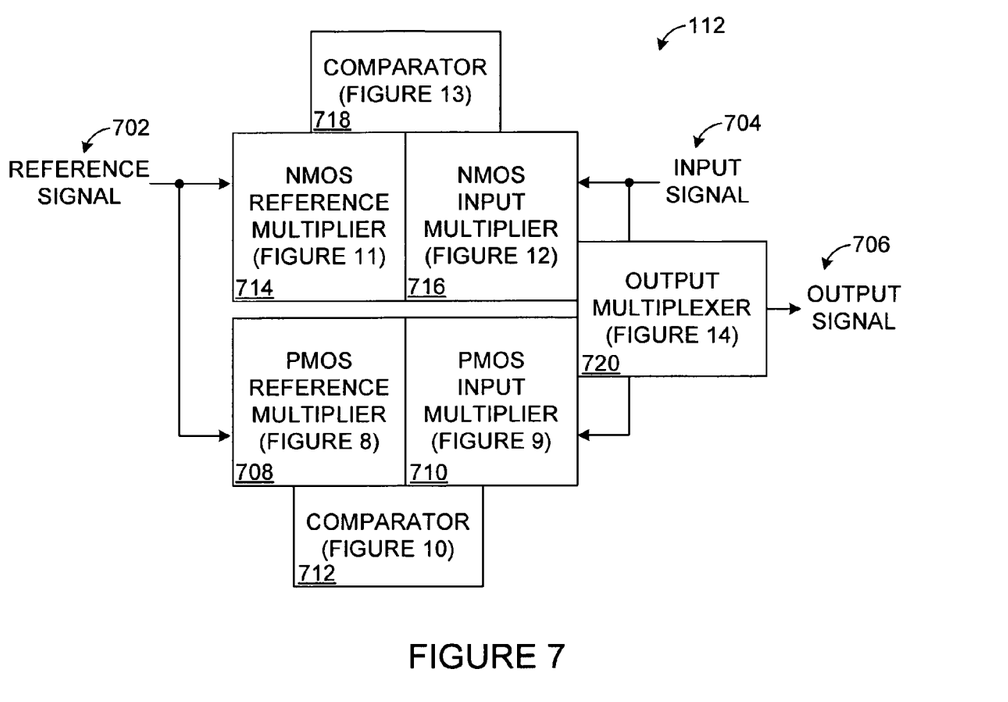
FIGS. 7 through 14 illustrate an example loss of signal detector in a serial receiver according to one embodiment of this disclosure.

FIGS. 7 through 14 illustrate an example loss of signal detector in a serial receiver according to one embodiment of this disclosure. More specifically, FIG. 7 illustrates an example loss of signal detector 112, and FIGS. 8 through 14 illustrate example components of the loss of signal detector 112. The embodiments of the loss of signal detector 112 and its components shown in FIGS. 7 through 14 are for illustration only. Other embodiments of the loss of signal detector 112 or its components could be used without departing from the scope of this disclosure. Also, for ease of explanation, the loss of signal detector 112 is described as operating in the serial receiver 100 of FIGS. 1 through 6. The loss of signal detector 112 could operate in any other suitable device or system.

In general, the loss of signal detector 112 attempts to detect when an input signal falls within or outside of specified threshold limits. The loss of signal detector 112 detects this condition using a reference signal 702 (which defines the threshold limits) and an input signal 704. As examples, the reference signal 702 could represent the bias voltages 212-214 generated by the biasing circuit 102 of the serial detector 100. The input signal 704 could represent the differential signals 402a-402b received by the input stage 106 of the serial detector 100. Using these signals, the loss of signal detector 112 generates an output signal 706 indicative of whether the input signal 704 falls within or outside of the threshold limits.

In this example, the loss of signal detector 112 includes a PMOS reference multiplier 708 and a PMOS input multiplier 710, which feed a comparator 712. Similarly, the loss of signal detector 112 includes an NMOS reference multiplier 714 and an NMOS input multiplier 716, which feed a comparator 718. The comparators 712, 718 produce loss of signal indicators that are provided to an output multiplexer 720, which selects one of the indicators from one of the comparators 712, 718 as the output signal 706. In particular embodiments, the multipliers 708-710 and 714-716 represent Gilbert multipliers that rectify the reference and input signals 702-704.

Figure 8:
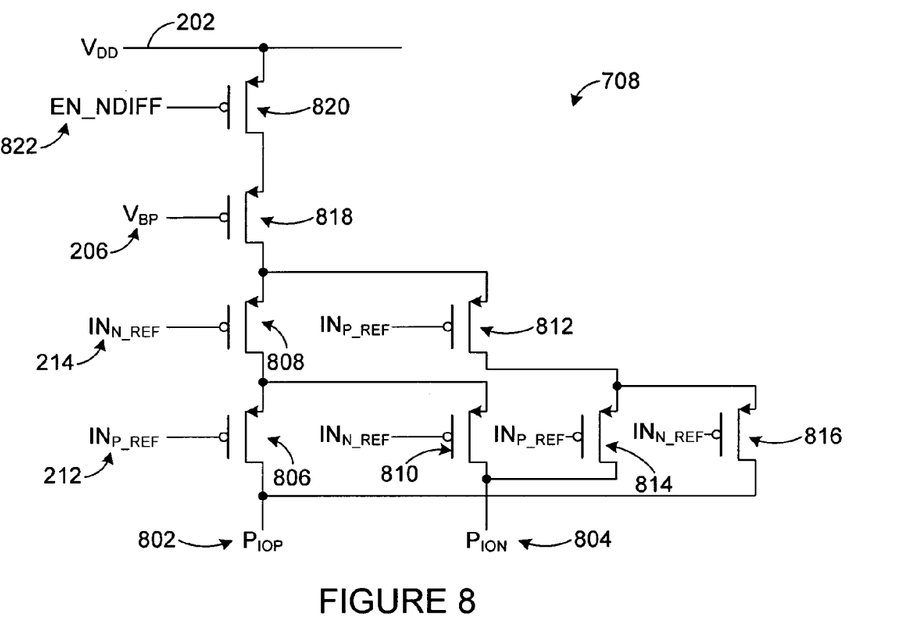

As shown in FIG. 8, the PMOS reference multiplier 708 produces two output signals 802-804 (such as currents), which are provided to the comparator 712. In this example, the PMOS reference multiplier 708 includes PMOS transistors 806-820. In particular embodiments, the transistors 806-820 have their bulks coupled to the voltage rail 202. Here, the transistors 806-816 receive and rectify a reference voltage, represented by the differential bias voltages 212-214 produced by the biasing circuit 102. The reference voltage may be approximately equal to the common mode voltage 314, such as by being within ±25 mV of the common mode voltage 314. The transistor 818 functions as a current source using the bias voltage 206 generated by the biasing circuit 102. The transistor 820 functions as a switch to enable and disable the PMOS reference multiplier 708 based on an enable signal 822. The enable signal 822 could represent the same enable signal 420 produced by the comparator 110 or an enable signal produced by another component in the serial receiver 100.

Figure 9:
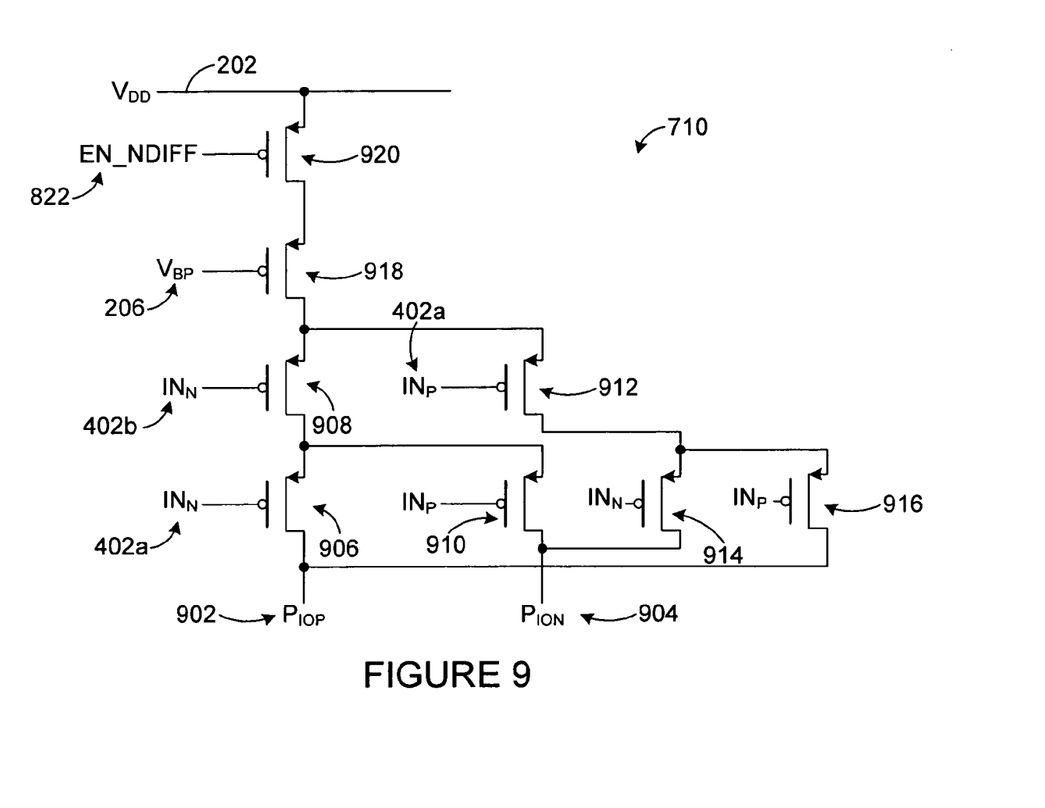

As shown in FIG. 9, the PMOS input multiplier 710 has a similar layout and design as the PMOS reference multiplier 708. In this example, the PMOS input multiplier 710 produces two output signals 902-904 (such as currents), which are provided to the comparator 712. In this example, the PMOS input multiplier 710 includes PMOS transistors 906-920. In particular embodiments, the PMOS transistors 906-920 have their bulks coupled to the voltage rail 202. Here, the transistors 906-916 receive and rectify an input signal, represented by the differential input signals 402a-402b. The transistor 918 functions as a current source using the bias voltage 206 generated by the biasing circuit 102. The transistor 920 functions as a switch to enable and disable the PMOS input multiplier 710 based on the enable signal 822.

In general, when the voltage of the reference signal (represented by differential signals 212-214) and the voltage of the input signal (represented by differential signals 402a-402b) are equal, the output signals 802-804 from the multiplier 708 may be equal, and the output signals 902-904 from the multiplier 710 may be equal. The output signals 802-804 may become unequal when the voltage of the reference signal and the voltage of the input signal are not equal, and the output signal 802 or 804 that is larger depends on whether the input signal is larger or smaller than the reference signal.

Figure 10:
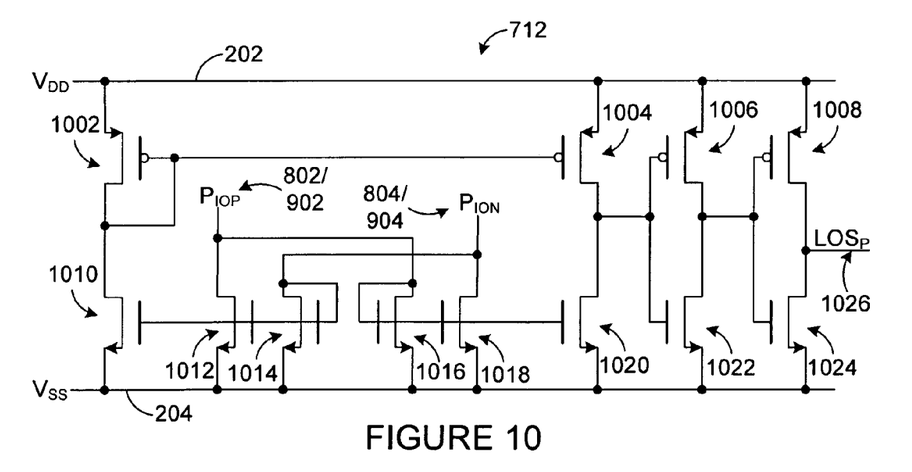

The output signals 802 and 902 are summed, and the output signals 804 and 904 are summed. The summed signals are then fed into the comparator 712. As shown in FIG. 10, the comparator 712 includes various components coupled between the voltage rails 202-204. In this example, the comparator 712 represents a current-mode comparator and includes PMOS transistors 1002-1008 and NMOS transistors 1010-1024. In particular embodiments, the transistors 1002-

1008 have their bulks coupled to the voltage rail 202, and the NMOS transistors 1010-1024 have their bulks coupled to the voltage rail 204.

In this example embodiment, the summed currents 802/902 and 804/904 are fed to the transistors 1012-1018, which include a pair of diodes in parallel with cross-coupled NMOS transistors. This configuration provides negative resistance and slight positive feedback so that gain is maximized and hysteresis is minimized. The diode currents are then mirrored and summed and the gain is increased in several stages using the remaining transistors to produce a digital output 1026. The digital output 1026 indicates whether a loss of signal condition has been detected, or whether the input signal falls within the threshold limits. The reference signal used here to produce the digital output 1026 achieves independence from the common mode voltage 314 using the reference multiplier 708.

Figure 11:
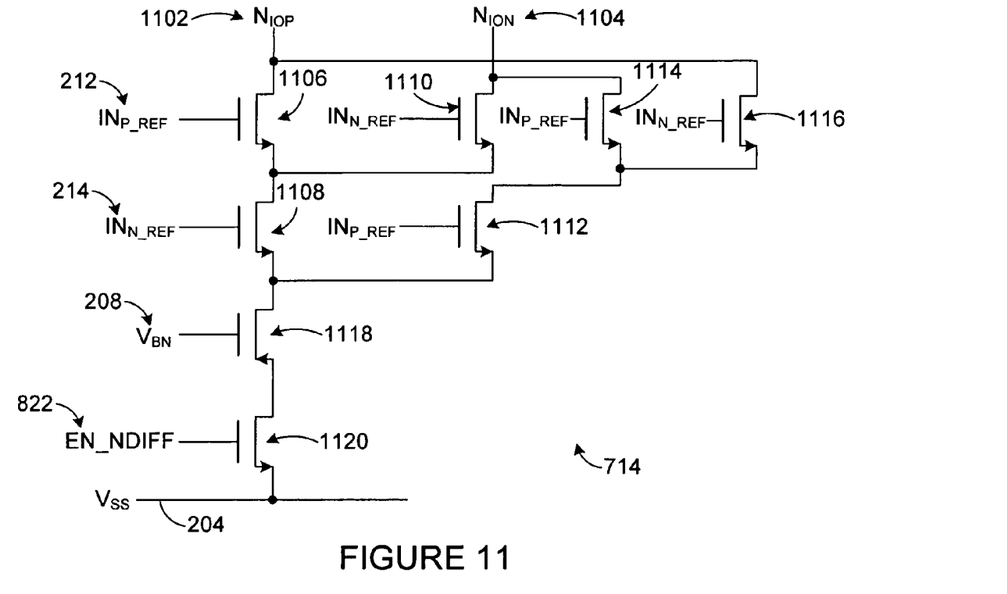

The NMOS reference multiplier 714, NMOS input multiplier 716, and comparator 718 have a similar structure as the PMOS reference multiplier 708, PMOS input multiplier 710, and comparator 712, respectively. However, the NMOS circuits use NMOS transistors in place of PMOS transistors and the voltage rail 204 in place of the voltage rail 202. For example, as shown in FIG. 11, the NMOS reference multiplier 714 generates two output signals 1102-1104 using NMOS transistors 1106-1120. In particular embodiments, the transistors 1106-1120 have their bulks coupled to the voltage rail 204. The transistors 1106-1116 may rectify a reference signal (differential signals 212-214), the transistor 1118 may provide a current source, and the transistor 1120 may act as a switch to enable/disable the NMOS reference multiplier 714.

Figure 12:
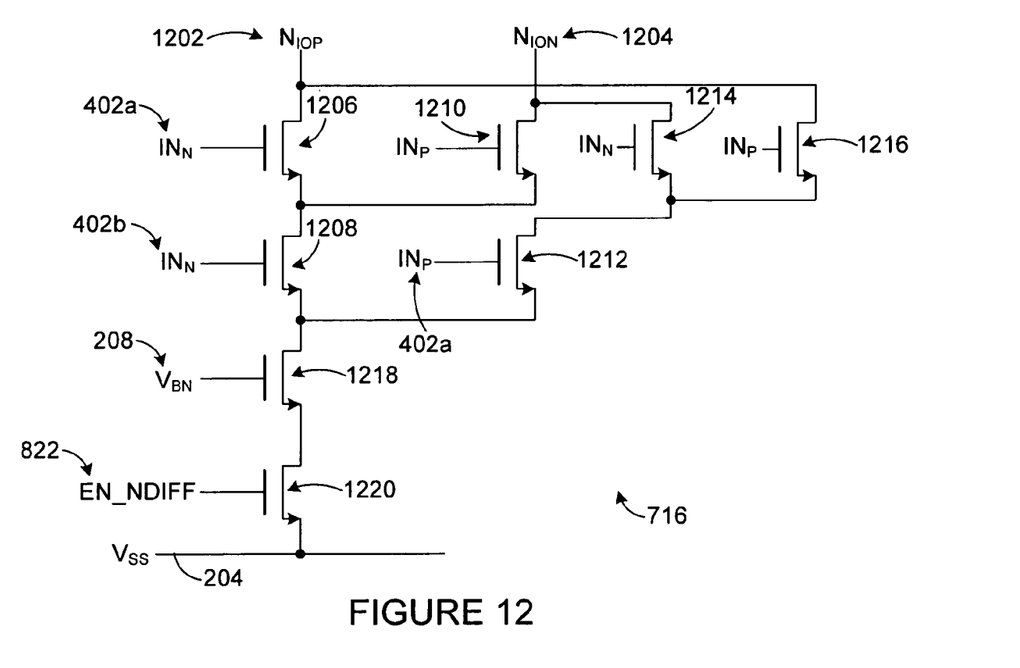

As shown in FIG. 12, the NMOS input multiplier 716 generates two output signals 1202-1204 using NMOS transistors 1206-1220. In particular embodiments, the transistors 1206-1220 have their bulks coupled to the voltage rail 204. The transistors 1206-1216 may rectify an input signal (differential signals 402a-402b), the transistor 1218 may provide a current source, and the transistor 1220 may act as a switch to enable/disable the NMOS input multiplier 716.

Figure 13:
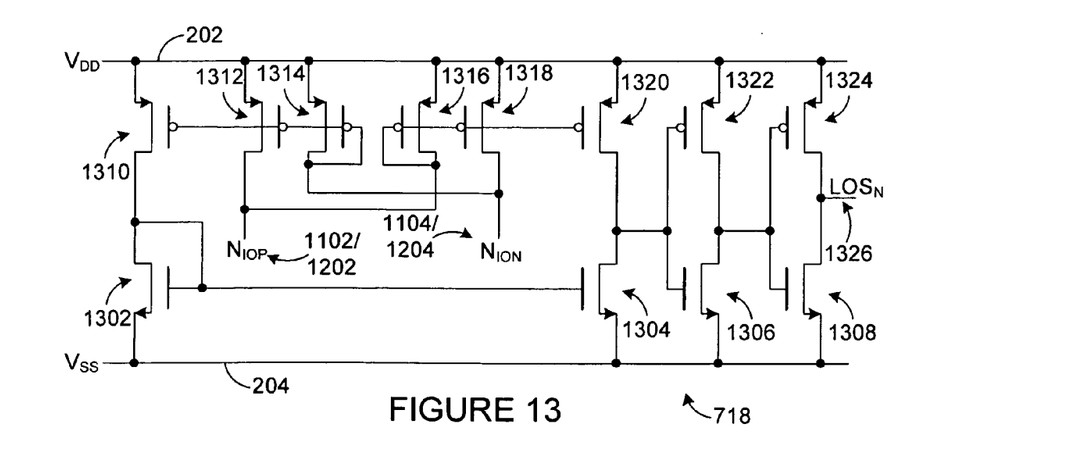

The output signals 1102 and 1202 are summed, and the output signals 1104 and 1204 are summed. The summed signals are then fed into the comparator 718. As shown in FIG. 13, the comparator 718 includes various components coupled between the voltage rails 202-204. In this example, the comparator 718 represents a current-mode comparator and includes NMOS transistors 1302-1308 and PMOS transistors 1310-1324. In particular embodiments, the transistors 1302-1308 have their bulks coupled to the voltage rail 204, and the transistors 1310-1324 have their bulks coupled to the voltage rail 202. In this example embodiment, the summed currents 1102/1202 and 1104/1204 are fed to the transistors 1312-1318, which include a pair of diodes in parallel with cross-coupled PMOS transistors. The diode currents are then mirrored and summed and the gain is increased in several stages using the remaining transistors to produce a digital output 1326. The digital output 1326 indicates whether a loss of signal condition has been detected.

Figure 14:
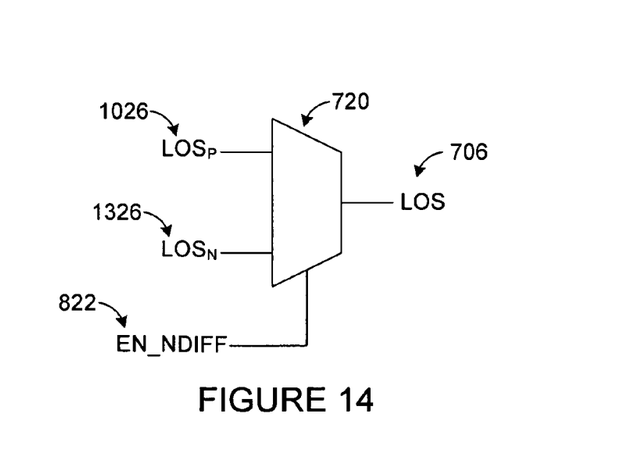

As shown in FIG. 14, the output multiplexer 720 receives the digital output 1026 produced by the comparator 712 and the digital output 1326 produced by the comparator 718. The output multiplexer 720 then selects one of these signals as a final LOS output signal 706. The output signal 706 indicates whether an input signal 704 falls within the threshold limits. The output multiplexer 720 is controlled by the enable signal 822, which also controls whether the multipliers 708-710 or the multipliers 714-716 are rectifying the reference and input signals 702-704. In this example, the PMOS reference multiplier 708, PMOS input multiplier 710, and comparator 712 may be used when the common mode voltage is near zero. As the common mode voltage increase from zero, the NMOS differential pair in the serial receiver 100 is activated, and the loss of signal detector 112 switches to using the NMOS reference multiplier 714, NMOS input multiplier 716, and comparator 718. In this way, the loss of signal detector 112 can ensure that the loss of signal functionality is available when either differential pair is used in the serial receiver 100.

Although FIGS. 7 through 14 illustrate an example loss of signal detector 112 in a serial receiver 100 and its components, various changes may be made to FIGS. 7 through 14. For example, while FIGS. 7 through 14 illustrate example embodiments of the components in the loss of signal detector 112, the components in the loss of signal detector 112 could have any other suitable design or layout. Also, while specific components and values have been described above, other embodiments of the loss of signal detector 112 could use different components or values.

Figure 15:
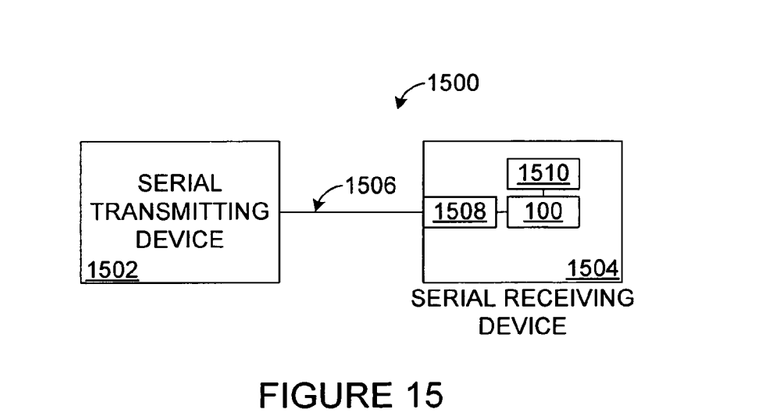
FIG. 15 illustrates an example serial transmission system according to one embodiment of this disclosure.

FIG. 15 illustrates an example serial transmission system 1500 according to one embodiment of this disclosure. In this example embodiment, the system 1500 includes a serial transmitting device 1502 and a serial receiving device 1504, which communicate over a serial communication link 1506. The serial transmitting device 1502 could represent any suitable transmitting device capable of transmitting data over one or more serial links.

The serial receiving device 1504 includes an interface 1508, a serial receiver 100, and a processor 1510. The interface 1508 represents any suitable structure capable of facilitating communication between the serial receiver 100 and a serial link 1506. The interface 1508 could, for example, represent a port capable of receiving and holding a serial link 1506, such as a wire. The processor 1510 represents any suitable processing device capable of using data recovered from a serially-transmitted signal by the serial receiver 100, such as a microprocessor or microcontroller. The serial link 1506 represents any suitable serial link or links.

The system 1500 shown in FIG. 15 could be used in any device or system that uses one or more serial communication links 1504. For example, the system 1500 could be used in a computing device, a communication or computing network, or other electronic device or system that uses a high-speed serial communication link or links.

In particular embodiments, the serial receiver 100 may satisfy the following specifications. The serial receiver 100 has an integrated 100Ω termination ±15% (based on process variations). The serial receiver 100 supports fail-safe operations, including contingencies for open input pins, terminated input pins (cable unplugged or noisy environment), and shorted inputs. Noise can be overcome by external fail-safe biasing (via the biasing voltage 276), while other conditions can be sensed by the serial receiver 100. The receiver's minimum and maximum operating voltages can be based on the Telecommunications Industry Association (TIA)/Electronic Industries Alliance (EIA) 644-A standard (section 4.2.4). These operating voltages include the ones shown in Table 1.

TABLE 1

|  | Minimum | Typical | Maximum |
| --- | --- | --- | --- |
| Nominal Input Voltage Operating Range | 250 mV | 350 mV | 450 mV |
| Maximum Input Voltage Operating Range | 100 mV |  | 600 mV |

TABLE 1-continued

| | Minimum | Typical | Maximum |
|---|---|---|---|
| Input Common Mode | 0.05 V | 1.2 V | 2.35 V |
| Maximum Input Voltage | 0 V | | 2.4 V |
| Loss Of Signal Detection Threshold | | ±50 mV | |
| Output Voltage (Rpoly Tracking) | | | 400 mV |

Although FIG. 15 illustrates one example of a serial transmission system 1500, various changes may be made to FIG. 15. For example, the design and layout of the serial receiving device 1500 is for illustration only. The serial receiving device 1500 could have any other suitable design or arrangement.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus, comprising:
an input circuit operable to receive an input signal, the input circuit comprising transistors forming a first differential pair associated with a first current source and transistors forming a second differential pair associated with a second current source;
an output circuit coupled to the input circuit and operable to generate an output signal based on the input signal;
a sensing circuit operable to estimate a voltage associated with one of the current sources, wherein the sensing circuit comprises a third differential pair formed by transistors that are replicas of the transistors in one of the first and second differential pairs; and
a comparator operable to compare the estimated voltage and a reference voltage and to selectively enable one of the first and second differential pairs and disable the other of the first and second differential pairs based on the comparison.

2. The apparatus of claim 1, wherein:
the input circuit further comprises a first switch associated with the first differential pair and a second switch associated with the second differential pair; and
the comparator is operable to control the first and second switches to selectively enable one of the first and second differential pairs and disable the other of the first and second differential pairs.

3. The apparatus of claim 1, wherein the comparator comprises:
transistors forming diodes coupled in parallel and operable to receive the reference voltage and the estimated voltage; and
cross-coupled transistors coupled in series with the transistors forming the diodes.

4. The apparatus of claim 1, wherein:
the first differential pair, the first current source, and the first switch comprise Positive-Channel Metal Oxide Semiconductor (PMOS) transistors; and
the second differential pair, the second current source, the second switch, and the third differential pair comprise Negative-Channel Metal Oxide Semiconductor (NMOS) transistors.

5. The apparatus of claim 2, wherein:
the comparator is further operable to control the first and second switches to disable the enabled differential pair and enable the disabled differential pair; and
the comparator implements a hysteresis function to reduce a number of times the first and second differential pairs are enabled and disabled.

6. The apparatus of claim 1, wherein:
the input signal is a differential input signal;
the input circuit further comprises two resistors operable to receive the differential input signal, wherein a common mode voltage is formed between the resistors; and
gates of the transistors forming the third differential pair are operable to receive the common mode voltage.

7. The apparatus of claim 1, further comprising a biasing circuit operable to generate one or more bias voltages including the reference voltage used by the comparator.

8. The apparatus of claim 7, wherein the biasing circuit comprises a voltage generator operable to generate a saturation reference voltage associated with a saturation voltage of one of the current sources, the reference voltage used by the comparator based on the saturation reference voltage.

9. The apparatus of claim 7, wherein the one or more bias voltages further comprise:
two bias voltages used by the input circuit; and
two bias voltages used by a loss of signal detector, the loss of signal detector operable to detect when the input signal falls below a threshold level.

10. A device, comprising:
an interface operable to receive an input signal communicated over a communication link; and
a receiver comprising:
an input circuit operable to receive the input signal, the input circuit comprising transistors forming a first differential pair associated with a first current source and transistors forming a second differential pair associated with a second current source;
an output circuit coupled to the input circuit and operable to generate an output signal based on the input signal;
a sensing circuit operable to estimate a voltage associated with one of the current sources, wherein the sensing circuit comprises a third differential pair formed by transistors that are replicas of the transistors in one of the first and second differential pairs; and
a comparator operable to compare the estimated voltage and a reference voltage and to selectively enable one of the first and second differential pairs and disable the other of the first and second differential pairs based on the comparison.

11. The device of claim 10, wherein:
the input circuit further comprises a first switch associated with the first differential pair and a second switch associated with the second differential pair; and
the comparator is operable to control the first and second switches to selectively enable one of the first and second differential pairs and disable the other of the first and second differential pairs.

12. The device of claim 11, wherein:
the first differential pair, the first current source, and the first switch comprise Positive-Channel Metal Oxide Semiconductor (PMOS) transistors; and
the second differential pair, the second current source, the third differential pair, and the second switch comprise Negative-Channel Metal Oxide Semiconductor (NMOS) transistors.

13. The device of claim 11, wherein:
the comparator is further operable to control the first and second switches to disable the enabled differential pair and enable the disabled differential pair; and
the comparator implements a hysteresis function to reduce a number of times the first and second differential pairs are enabled and disabled.

14. The device of claim 10, wherein:
the input signal is a differential input signal;
the input circuit further comprises two resistors operable to receive the differential input signal, wherein a common mode voltage is formed between the resistors; and
gates of the transistors forming the third differential pair are operable to receive the common mode voltage.

15. The device of claim 10, further comprising a biasing circuit operable to generate one or more bias voltages including the reference voltage used by the comparator.

16. The device of claim 15, wherein the biasing circuit comprises a voltage generator operable to generate a saturation reference voltage associated with a saturation voltage of one of the current sources, the reference voltage used by the comparator based on the saturation reference voltage.

17. A method, comprising:
receiving an input signal and generating an output signal based on the input signal using transistors forming a first differential pair associated with a first current source and a second differential pair associated with a second current source;
estimating a voltage associated with one of the current sources using a third differential pair, the third differential pair formed by transistors that are replicas of the transistors in one of the first and second differential pairs;
comparing the estimated voltage and a reference voltage; and
selectively enabling one of the first and second differential pairs and disabling the other of the first and second differential pairs based on the comparison, the output signal generated using the enabled differential pair.

18. The method of claim 17, wherein selectively enabling one of the first and second differential pairs and disabling the other of the first and second differential pairs comprises using a first switch associated with the first differential pair and a second switch associated with the second differential pair to enable and disable the first and second differential pairs.

19. The method of claim 17, wherein:
the input signal is a differential input signal;
the method further comprises generating a common mode voltage based on the differential input signal; and
estimating the voltage associated with one of the current sources comprises providing the common mode voltage to gates of the transistors forming the third differential pair.

20. The method of claim 17, further comprising generating a saturation reference voltage associated with a saturation voltage of one of the current sources, the reference voltage based on the saturation reference voltage.

* * * * *